United States Patent
Slep et al.

(10) Patent No.: US 10,428,196 B2
(45) Date of Patent: Oct. 1, 2019

(54) CURABLE NANO-COMPOSITES FOR ADDITIVE MANUFACTURING

(71) Applicant: Schmutz IP, LLC, Lawrenceville, GA (US)

(72) Inventors: Daniel Slep, Lawrenceville, GA (US); Linghui Wu, Lawrenceville, GA (US)

(73) Assignee: Schmutz IP, LLC, Lawrenceville, GA (US)

( * ) Notice: Subject to any disclaimer, the term of this patent is extended or adjusted under 35 U.S.C. 154(b) by 0 days.

(21) Appl. No.: 15/534,848

(22) PCT Filed: Dec. 10, 2015

(86) PCT No.: PCT/US2015/065100
§ 371 (c)(1),
(2) Date: Jun. 9, 2017

(87) PCT Pub. No.: WO2016/094723
PCT Pub. Date: Jun. 16, 2016

(65) Prior Publication Data
US 2018/0030235 A1    Feb. 1, 2018

Related U.S. Application Data

(60) Provisional application No. 62/090,600, filed on Dec. 11, 2014.

(51) Int. Cl.
| | |
|---|---|
| *C08F 2/46* | (2006.01) |
| *C08F 2/50* | (2006.01) |
| *C08G 61/04* | (2006.01) |
| *C08K 3/04* | (2006.01) |
| *C09D 4/00* | (2006.01) |
| *B33Y 70/00* | (2015.01) |
| *C08F 220/18* | (2006.01) |
| *C08F 222/10* | (2006.01) |
| *H05K 1/09* | (2006.01) |
| *C08K 3/013* | (2018.01) |

(52) U.S. Cl.
CPC ............ *C08K 3/042* (2017.05); *B33Y 70/00* (2014.12); *C08F 220/18* (2013.01); *C08F 222/10* (2013.01); *C09D 4/00* (2013.01); *H05K 1/097* (2013.01); *C08K 3/013* (2018.01); *C08K 2201/001* (2013.01); *C08K 2201/011* (2013.01); *H05K 1/095* (2013.01); *H05K 2201/0323* (2013.01)

(58) Field of Classification Search
CPC ... C08K 3/042; C08K 2201/001; H05K 1/097
USPC .................. 522/65, 6, 71, 189, 184, 1; 520/1
See application file for complete search history.

(56) References Cited

U.S. PATENT DOCUMENTS

| | | | |
|---|---|---|---|
| 2002/0128340 A1* | 9/2002 | Young ................... | B41M 3/006 522/1 |
| 2007/0196630 A1* | 8/2007 | Hayes ..................... | B32B 17/10 428/195.1 |
| 2008/0160733 A1 | 7/2008 | Hieslmair et al. | |
| 2008/0275171 A1 | 11/2008 | Song et al. | |
| 2009/0082489 A1* | 3/2009 | Breton ................... | C09D 11/34 523/200 |
| 2009/0121190 A1 | 5/2009 | Parce et al. | |
| 2017/0368742 A1* | 12/2017 | Slep ...................... | B29C 64/112 |

FOREIGN PATENT DOCUMENTS

| | | | | |
|---|---|---|---|---|
| WO | WO-2013168955 A1 * | 11/2013 | ............ | B82Y 15/00 |
| WO | WO2014118783 A1 | 8/2014 | | |
| WO | WO2014179746 A1 | 11/2014 | | |

OTHER PUBLICATIONS

International Search Report and Written Opinion of Application No. PCT/US2015/065100 dated Feb. 18, 2016, 11 pages.

* cited by examiner

*Primary Examiner* — Jessica Whiteley
(74) *Attorney, Agent, or Firm* — Thomas|Horstemeyer, LLC

(57) ABSTRACT

Curable liquid nano-composites for additive manufacturing of objects having precisely controlled mechanical and electronic properties are provided. Methods of making the curable nano-composites, and methods of additive manufacturing using the nano-composites are also provided. Additionally, objects made from additive manufacturing using the curable nano-composites are provided. In one or more embodiments the nano-composites can contain one or more cross-linkable monomers or oligomers; a photo-initiator; and a nanoparticle. In some embodiments the curable liquid nano-composite can have a viscosity prior to curing of about 1-150 cP at room temperature and pressure. The curable nano-composite can be used for additive manufacturing by printing the curable nano-composite. The printed objects can include various opto-electronic devices such as conductive coatings, electrochromic devices, electronic interconnects, antennae, RFID tags, transistors, diodes, photovoltaics, light emitting diodes, and capacitors.

19 Claims, No Drawings

CURABLE NANO-COMPOSITES FOR ADDITIVE MANUFACTURING

CROSS-REFERENCE TO RELATED APPLICATION

This application is the National Stage of International Application No. PCT/US2015/065100, filed 10 Dec. 2015, which claims the benefit of and priority to U.S. Provisional Patent Application No. 62/090,600 entitled "CURABLE NANO-COMPOSITES FOR ADDITIVE MANUFACTURING", filed on 11 Dec. 2014, all of which are expressly incorporated by reference as if fully set forth herein in their entirety.

FIELD OF THE DISCLOSURE

The present disclosure is generally in the field of composite materials for additive manufacturing, especially for additive manufacturing of devices with electronic components

BACKGROUND OF THE DISCLOSURE

Additive Manufacturing (AM), also known as 3D printing is has found many applications in recent years. Additive manufacturing is a process by which an object is defined three dimensionally by a series of layers. The object is then produced by creating/laying down material in rows one layer at a time.

There exists systems that use modified inkjet type technology to 'print' material onto a substrate, so building the object. A type of AM process utilizing ink jet print heads is described, for example, in U.S. Pat. No. 5,555,176 to Menhennett, et al. Another type of AM process which extrudes a bead of material to build a part is described, for example, in U.S. Pat. No. 5,303,141 to Batchelder et al.

Another type that can utilize an inkjet print head is a UV curable or photopolymer material such as described in U.S. Pat. No. 6,259,962. In this process monomers are used which polymerize by irradiation with ultraviolet light in the presence of a photo initiator.

A problem with current photopolymer materials is that for specific applications, they lack the physical properties and/or optical properties needed. Currently, when adding composite materials to photo curable materials, this usually results in nozzle clogging of the inkjet head and poor curing capabilities.

SUMMARY

A curable liquid nano-composite for additive manufacturing of objects having precisely controlled mechanical and electronic properties is provided. In various aspects the curable liquid nano-composite includes nanoparticles. Methods of making the curable nano-composites, and methods of additive manufacturing using the nano-composites are also provided. Additionally, objects made from additive manufacturing using the curable nano-composites are provided.

In one or more embodiments the nano-composite can contain one or more cross-linkable monomers or oligomers; a photo-initiator; and a nanoparticle. In some embodiments the curable liquid nano-composite can have a viscosity prior to curing of about 1-150 cP at room temperature and pressure. The curable nano-composite can be used for additive manufacturing by printing the curable nano-composite. The printed objects can include various opto-electronic devices such as conductive coatings, electrochromic devices, electronic interconnects, antenna, RFID tags, transistors, diodes, photovoltaics, light emitting diodes, and capacitors.

The curable nano-composites can contain one or more of a variety of cross-linkable monomers. The cross-linkable monomers can be present in a combined amount from about 70-98 wt % based upon the total weight of the nano-composite. The monomers can include monoacrylates and higher order acrylates. In some embodiments the nano-composite contains higher order acrylates, e.g. di-acrylates and tri-acrylates, that are present in a combined amount from about 20-40 wt % based upon the total weight of the nano-composite.

The nano-composite can contain one or more oligomers. The one or more oligomers can be used alone without the monomer(s), can be used in combination with the monomer(s) or can be optional. An oligomer can be used with higher viscosity printing heads and can help with curing. Lower molecular weight oligomers may be preferred, for example having a molecular weight in the range of about 500 to about 5000. Suitable oligomers include molecular complexes consisting of monomer units of acrylates, methacrylates, urethanes, or methacrylate/urethanes, or combinations thereof.

The nano-composite can contain one or more nanoparticles. The nanoparticles can be organic nanoparticles or inorganic nanoparticles, typically present in an amount of about 1-25 wt % based upon the total weight of the nano-composite. The nanoparticle can have a largest diameter of about 15-200 nm. In various aspects the nanoparticle can be less than 100 nm and can be present in an amount of 10 wt % or less based upon the total weight of the nano-composite. The nanoparticle can be an organic nanoparticle, such as carbon nanotubes, fullerenes, and graphene. Examples of inorganic nanoparticles can include metal nanoparticles, metal oxide nanoparticles, metal chalcogenide nanoparticles, metal hydroxide nanoparticles, and semiconductor nanoparticles.

The curable nano-composite can include one or more photo-initiators that initiate the cross-linking. Typical amounts of photo-initiator include about 1-10 wt % based upon the total weight of the nano-composite. In various aspects, the amount of the photo-initiator(s) can be 1-5 wt % based upon the total weight of the nano-composite. Commercially available photo-initiators include Omnirad 1000; Omnirad 73, Omnirad 481, Omnirad 248, Omnirad TPO, Omnirad 4817, Omnirad 4-phenyl benzophenone (4-PBZ), PHOTOMER® 4967, Irgacure 184, Irgacure 500, Irgacure 907, Irgacure 369, Irgacure 379, Irgacure 127, Irgacure 1700, Irgacure 651, Irgacure 819, Irgacure 1000, Irgacure 1300, Irgacure 1870, Darocur 1173, Darocur 2959, Darocur 4265, Darocur ITX, Lucerin TPO, Esacure KT046, Esacure KIP150, Esacure KT37, and Esacure EDB, H-Nu 470, H-Nu 470X, Genopol TX-1, and combinations thereof. The photo-initiator can be optimized to the light source used to initiate curing of the liquid nano-composite.

The nano-composite can also optionally include a polymerization inhibitor, such as phenolic antioxidants, alkylated diphenyl amines, phenyl-α-naphthylamines, phenyl-β-naphthylamines, and alkylated α-naphthylamines. The polymerization inhibitor, if present, is typically present in an amount less than about 2 wt %. The polymerization inhibitor can be added to avoid random polymerization. It can also be added to improve the shelf-life of the liquid nano-composite. Additional additives can also be included in the nano-composite such as ultraviolet (UV) absorbers, photochromic compounds, viscosity modifiers, colorants, pH adjusters, and fillers.

In an embodiment, a method of additive manufacturing is provided. The method can include comprising printing a curable nano-composite of any one or more of the foregoing aspects.

In an embodiment, a printed object is provided. The printed object can be formed by additive manufacturing with the curable nano-composite of any one or more of the foregoing aspects. The printed object can be an opto-electronic device selected from the group consisting of conductive coatings, electrochromic devices, electronic interconnects, antenna, RFID tags, transistors, diodes, photovoltaics, light emitting diodes, and capacitors.

In an embodiment an antenna is provided. The antenna can be prepared by additive manufacturing using the curable nano-composite of any one or more of the foregoing aspects.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

DETAILED DESCRIPTION

Curable nano-composites are provided having useful mechanical, electrical, and optical properties. The curable nano-composites can be used for the additive manufacturing of a variety of opto-electronic devices. Methods of making the curable nano-composites and methods of using the nano-composites to make a variety of optical lenses are provided. Although illustrative embodiments are described herein, those embodiments are mere exemplary implementations of the nano-composites, methods and products produced therefrom. One skilled in the art will recognize other embodiments are possible. All such embodiments are intended to fall within the scope of this disclosure. Moreover, all references cited herein are intended to be and are hereby incorporated by reference into this disclosure as if fully set forth herein. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

Discussion

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, synthetic inorganic chemistry, analytical chemistry, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 0° C. and 1 bar.

It is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Curable Nano-Composites

Curable nano-composites are provided for additive manufacturing, e.g. by 3D printing. The term "nano-composite" is used herein to refer to any material; e.g. a solid, liquid, or dispersion; having one or more host materials into which a plurality of nanoparticles are dispersed. With regards to curable nano-composites, the term "nano-composite" can be used to refer to both the uncured precursor composite (typically a liquid or solid-in-liquid dispersion) as well as the cured composite (typically an amorphous solid). For example, the nano-composites can be prepared as a liquid or solid-in-liquid dispersion of nanoparticles where the nano-composite can be cured to form a solid having the nanoparticles dispersed therein. The curable nano-composite can be a curable resin containing the nanoparticles.

The host material can contain one or more cross-linkable monomers, or oligomers, or a combination thereof. The curable nano-composites can generally be cured by reacting the host material to form a cross-linked or network solid. A variety of methods are available for cross-linking the host materials. For example, heat, light, or chemical initiation can be used to initiate cross-linking of the host materials. In some embodiments the curable nano-composite is radiation curable, i.e. the cross-linking is initiated by one or more wavelengths of light.

Cross-Linkable Monomers

The curable nano-composite can contain one or more cross-linkable monomers. For example, the curable nano-composite can contain 2, 3, 4, 5, or more different cross-linkable monomers. The term "monomer", as used herein, generally refers to an organic molecule that is less than 2,000 g/mol in molecular weight, less than 1,500 g/mol, less than 1,000 g/mol, less than 800 g/mol, or less than 500 g/mol. Monomers are non-polymeric and/or non-oligomeric.

The cross-linkable monomers will generally contain one or more reactive functional groups that can be reacted to form the cross-linked structure upon curing. In some embodiments the cross-linkable monomers are acrylates. The cross-linkable monomers can be monoacrylates, diacrylates, or higher acrylates that can be either substituted or unsubstituted. The cross-linkable monomers can be present in a combined amount of about 70-98 wt %, 75-95 wt %, 80-95 wt %, 80-90 wt %, or 82-97 wt % based upon the total weight of the curable nano-composite.

The curable nano-composite can contain one or more monoacrylates. Suitable monoacrylates can include, for example, 2-[2-(Vinyloxy)ethoxy]ethyl acrylate, 2-hydroxyethyl methacrylate, isodecyl acrylate, cyanoethyl methacrylate, hydroxypropyl methacrylate, p-dimethylaminoethyl methacrylate, and cyclohexyl methacrylate. The monoacrylate can be an acrylate ester of an aliphatic alcohol that can be a cycloaliphatic alcohol or a long-chain aliphatic alcohol. In some embodiments the monoacrylate is an acrylate ester of a substituted or unsubstituted alcohol having from 2-50, 5-40, 8-30, or 8-22 carbon atoms. In some embodiments the monoacrylates are present in a combined amount of about 70-98 wt %, 75-95 wt %, 80-95 wt %, 80-90 wt %, or 82-97 wt % based upon the total weight of the curable nano-composite. In some embodiments the monoacrylates are present in a combined amount of about 30-60 wt %, about 35-50 wt %, or about 35-45 wt %.

The curable nano-composite can contain one or more higher acrylates, e.g. diacrylates or triacrylates. Suitable diacrylates can include 1,4-butanediol diacrylate, 1,6-hexanediol diacrylate, neopentylglycol diacrylate, diethyleneglycol diacrylate, tetraethylene glycol diacrylate, tripropyleneglycol diacrylate, and dianol diacrylate. The diacrylate can include the acrylic acid diester of a substituted or unsubstituted di-alcohol having from 2-50, 5-40, 8-30, or 8-22 carbon atoms. Suitable triacrylates can include trimethylolpropane triacrylate, 3eo, 3po, and 5eo. In some embodiments, the diacrylates and triacrylates can be present in a combined amount of about 10-50 wt %, about 15-45 wt %, or about 20-40 wt %.

Oligomers

The curable nano-composites can contain one or more oligomers. The one or more oligomers can be present without the presence of the one or more monomers, can be present in combination with the one or more monomers or can be optional and not present at all. The term "oligomer" is used to refer to molecules having less than about 1,000 monomer repeat units, typically less than about 500, less than about 200, less than about 100 repeat units. In some embodiments the curable nano-composites contain 2, 3, 4, 5, or more different oligomers. In some embodiments the oligomer is a pre-polymer of one or more of the cross-linkable monomers, e.g. the oligomer can be a mono-functional or multifunctional oligomer containing from about 2 to about 100, about 2 to about 80, about 2 to about 60, or about 5 to about 50 monomer repeat units of any cross-linkable monomer described herein. In some embodiments the oligomers include electronically conducting oligomers such as oligoacetylenes, oligophenylenes such as p-terphenyl and derivatives thereof, and oligothiophenes such as terthiophene and derivatives thereof. In some embodiments, when the curable nano-composite contains both monomers and oligomers, the total amount of cross-linkable monomers and oligomers can be greater than about 70 wt %, preferably greater than about 75 wt %, e.g. about 75-99 wt %, about 75-95 wt %, or about 80-90 wt %.

Photo-Initiators

The curable nano-composite contains one or more photo-initiators. The term "photo-initiator," as the term is used herein, refers generally to any chemical species in the nano-composite that, upon absorbing one or more wavelengths of light, initiates the cross-linking of the cross-linkable monomers and/or oligomers. For example, upon absorption of light, the photo-initiator may produce free radicals, thereby inducing polymerization of the cross-linkable compounds (monomers, oligomers or (pre)polymers) of the nano-composite. The photo-initiator is typically present in an amount less than about 15 wt %, less than about 10 wt %, typically about 1-10 wt %, about 1-5 wt %, or about 2-5 wt %.

Photo-initiators can include, but are not limited to benzophenone and substituted benzophenones; 1-hydroxycyclohexyl phenyl ketone; thioxanthones such as isopropylthioxanthone; 2-hydroxy-2-methyl-1-phenylpropan-1-one, 2-benzyl-2-dimethylamino-(4-morpholinophenyl)butan-1-one, benzil dimethylketal, bis(2,6-dimethylbenzoyl)-2,4,4-trimethylpentylphosphine oxide, 2,4,6-trimethylbenzoyldiphenylphosphine oxide, 2-methyl-1-[4-(methylthio)phenyl]-2-morpholinopropan-1-one, 2,2-dimethoxy-1,2-diphenylethan-1-one or 5,7-diiodo-3-butoxy-6-fluorone.

Commercially available photo-initiators include Omnirad 1000; Omnirad 73, Omnirad 481, Omnirad 248, Omnirad TPO, Omnirad 4817, Omnirad 4-PBZ and PHOTOMER® 4967 from IGM RESINS; Irgacure 184, Irgacure 500, Irgacure 907, Irgacure 369, Irgacure 379, Irgacure 127, Irgacure 1700, Irgacure 651, Irgacure 819, Irgacure 1000, Irgacure 1300, Irgacure 1870, Darocur 1173, Darocur 2959, Darocur 4265 and Darocur ITX available from CIBA SPECIALTY CHEMICALS; Lucerin TPO available from BASF AG; Esacure KT046, Esacure KIP150, Esacure KT37 and Esacure EDB available from LAMBERTI; H-Nu 470 and H-Nu 470X available from SPECTRA GROUP Ltd.; Genopol TX-1 from Rahn AG; and combinations thereof.

Inhibitors

The curable nano-composites may contain one or more polymerization inhibitors to control the rate of polymerization and/or prevent random polymerization. Typical polymerization inhibitors include antioxidants such as phenolic antioxidants, alkylated diphenylamines, phenyl-α-naphthylamines, phenyl-β-naphthylamines, and alkylated α-naphthylamines. The polymerization inhibitors can be present at an amount less than about 5 wt %, less than about 2.5 wt %, less than about 2 wt %, or less than about 1 wt %.

Nanoparticles

The curable nano-composite can contain one or more nanoparticles. In some embodiments, the curable nano-composites can contain two, three, four, or more different nanoparticles. The nanoparticles can be organic nanoparticles or inorganic nanoparticles, e.g. the nanoparticles can be polymeric nanoparticles, metal nanoparticles, metal-oxide nanoparticles, or other nanoparticles. The nanoparticles can have any dimension necessary to achieve the desired properties. In some embodiments the nanoparticles have a greatest dimension from about 10-1,000 nm, about 10-800 nm, about 10-600 nm, about 10-500 nm, about 15-500 nm, about 15-400 nm, about 15-300 nm, about 15-200 nm, about 15-150 nm, about 20-120 nm, about 20-100 nm, or about 20-80 nm. In various aspects the nanoparticles can be less than 100 nm. The nanoparticles can be present in an amount of about 1-25 wt %, about 1-20 wt %, about 1-15 wt %, about 2-15 wt %, about 2-12 wt %, or about 2-10 wt %.

The curable nano-composite can contain one or more organic nanoparticles. The organic nanoparticles can include one or more carbon nanostructures such as carbon nanotubes, fullerenes, graphene, or polyaniline.

The curable nano-composite can include one or more inorganic nanoparticles. The curable nano-composite can contain one or more high refractive index inorganic nanoparticles, e.g. $TiO_2$, $ZrO_2$, amorphous silicon, PbS, or ZnS nanoparticles. The curable nano-composite can contain nanoparticles containing one or more metals (e.g., copper, silver, gold, iron, nickel, cobalt, indium, tin, or zinc) and/or metal compounds (e.g., metal oxides, metal chalcogenides, or metal hydroxides). Examples of the metal oxides include, but are not limited to, indium oxide, tungsten oxide, tin oxide, indium tin oxide (ITO), or zinc tin oxide (ZTO). In another embodiment, the nanoparticles may be made from one or more semiconductor materials. Examples of such semiconductor materials include, but are not limited to, silicon, silicon carbide, gallium arsenide, or indium phosphide. In some embodiments the nanoparticles include electronically conductive nanoparticles such as carbon nanotubes, fullerenes, or graphene; metal nanoparticles such as copper or silver nanoparticles; and metal oxide nanoparticles such as ITO and ZTO nanoparticles.

Additional Additives

The curable nano-composite can include one or more additional additives. The curable nano-composites can include additional additives that provide various effects or facilitate storage or fabrication. Additional additives can include surfactants, viscosity modifiers, colorants, pH adjusters, or fillers. The additional additives can be present in an amount, either individually or combined, up to about 10%, 8%, 6%, or 4% by weight based upon the weight of the curable nano-composite.

Printed Objects

Curable nano-composites described herein can be used to manufacture various printed objects having desired opto-electronic properties. For example, the curable nano-composites can be used to manufacture a variety of opto-electronic devices. For example, the curable nano-composites can be used for the additive manufacturing of conductive coatings, wearable electronics, electrochromic devices, electronic interconnects and electronic devices such as antenna, RFID tags, transistors, diodes, displays, photovoltaics, light emitting diodes, and capacitors.

Methods of Making Curable Nano-Composites

The curable nano-composites described herein can be made by any method generally known to those skilled in the art. The curable nano-composites can be made by combining one or more cross-linkable monomers, one or more photoinitiators, one or more nanoparticles, and optionally one or more oligomers, one or more inhibitors, and/or one or more polymerization inhibitors. The curable nano-composites can be stored prior to use. In some embodiments the curable nano-composites are stable for more than about 3 months, 6 months, 9 months, or 1 year. The curable nano-composites can be stored in the uncured (unreacted) form. The amount of the shelf-life of the nano-composites can be controlled by including various amounts of a polymerization or cross-linker inhibitor.

Methods of Using Curable Nano-Composites

The curable nano-composites can be used for the additive manufacturing of a variety of objects. The curable nano-composites can be used to print an object with enhanced materials strength for durability and/or with enhanced mechanical, optical or electronic characteristics.

One or more curable nano-composites can be used to precisely control the material properties in a layer-by-layer fashion. For example, by controlling the mixing of 2, 3, 4, or more different nano-composites during the printing the properties of the cured object can be precisely controlled in all directions.

The curable nano-composites can be printed onto a variety of substrates. In some embodiments the printed object is removed from the substrate after fabrication. The substrate can have a non-stick surface to prevent adhesion of the object to the substrate. The substrate can be, for example, a paper, glass, polymer, metal, or ceramic substrate.

The properties of the printed object can be controlled by changing the properties of the curable nano-composite(s) as well as by controlling the proportions of two or more nano-composites as they are mixed prior to printing. The nano-composites can be printed using a single head or a device having multiple heads. The heads may be adjusted to alter the droplet size and/or relative amounts of constituents in the nano-composites contained in the droplets.

In various aspects the head can be a jetable piezo head that can be used to deposit the curable nano-composites onto the substrate. Jetable piezo heads can provide excellent control over the position and amount of nano-composite deposited. The nano-composite droplets can be projected onto adjacent locations on the substrate so that consecutive droplets are adjoining. Such adjacent deposition preferably results in a continuous layer or film, and also tends to facilitate blending. Various droplet sizes and size distributions can be used. Droplet size is preferably selected to provide the desired gradation of properties in the resulting printed object. For example, smaller droplets tend to produce finer spatial resolution and finer control of material properties. The volume of the nano-composite droplet can be from about 3 to 5 picoliters up to about 100 picoliters.

Another advantage of the material composition is that the nozzles will not clog during the printing process allowing better printability.

Although it is described that ultraviolet light is used to cure the material composition of the present invention used therein, it is envisioned to use other energy sources, including infrared (IR) radiation and light emitting diodes (LED), to cure the material.

EXAMPLES

Prophetic Example 1

An exemplary nano-composite for additive manufacturing of an antenna can be prepared having a composition according to Table 1.

TABLE 1

Composition of an exemplary nano-composite composition

| Component | Weight Percent |
|---|---|
| 2-(2-Vinyloxyethoxy)ethyl acrylate | 20% |
| Isodecyl acrylate | 30% |
| Trimethylopropane trimethacrylate | 5% |
| 1,6 hexanediol diacrylate | 30% |
| PHOTOMER ® 4967 | 2.5% |
| Omnirad 4PBZ | 2.5% |
| graphene nanoparticles | 10% |

The amounts of the components in the above composition can be varied. For example, the weight percentage of each component can vary ±5% or less, or ±3% or less, or ±2% or less.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figure of the numerical value. In addition, the phrase "about 'x' to 'y'" includes "about 'x' to about 'y'".

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

The invention claimed is:

1. A curable liquid nano-composite for use with a jetable piezo head device for additive manufacturing of a semi-conductive component, the nano-composite comprising:
one or more cross-linkable diacrylates and/or triacryclates present in an amount from about 10-50 wt % based upon the total weight of the nano-composite;
a photo-initiator; and
an organic nanoparticle,
wherein the curable liquid nano-composite is configured for use in said jetable piezo head device to produce said semi-conductive component.

2. The curable liquid nano-composite of claim 1, further including one or more cross-linkable monomers or oligomers or both, wherein the diacrylates and/or triacrylates and the one or more cross-linkable monomers or oligomers or both are present in a combined amount from about 70-98 wt % based upon the total weight of the nano-composite.

3. The curable liquid nano-composite of claim 1, wherein the photo-initiator is present in an amount from about 1-10 wt % based upon the total weight of the nano-composite.

4. The curable liquid nano-composite of claim 1, wherein the nanoparticle is present in an amount from about 1-25 wt % based upon the total weight of the nano-composite.

5. The curable liquid nano-composite of claim 2, wherein the cross-linkable monomers include one or more mono-acrylates.

6. The curable liquid nano-composite of claim 1, wherein the cross-linkable diacrylates and/or triacrylates are present in an amount from about 20-40 wt % based upon the total weight of the nano-composite.

7. The curable liquid nano-composite of claim 1, wherein the photo-intiator is selected from the group consisting of: benzophenone and substituted benzophenones; 1-hydroxycyclohexyl phenyl ketone; thioxanthones such as isopropylthioxanthone; 2-hydroxy-2-methyl-1-phenylpropan-1-one, 2-benzyl-2-dimethylamino-(4-morpholinophenyl)butan-1-one, benzil dimethylketal, bis(2,6-dimethylbenzoyl)-2,4,4-trimethylpentylphosphine oxide, 2,4,6-trimethylbenzoyldiphenylphosphine oxide, 2-methyl-1-[4-(methylthio) phenyl]-2-morpholinopropan-1-one, 2,2-dimethoxy-1,2-diphenylethan-1-one or 5,7-diiodo-3-butoxy-6-fluorone; and combinations thereof.

8. The curable liquid nano-composite of claim 1, wherein the nanoparticle has a largest diameter of about 15-200 nm.

9. The curable liquid nano-composite of claim 1, wherein the organic nanoparticle selected from the group consisting of carbon nanotubes, fullerenes, graphene and polyaniline.

10. The curable liquid nano-composite of claim 1, further comprising a polymerization inhibitor selected from the group consisting of phenolic antioxidants, alkylated diphenyl amines, phenyl-α-naphthylamines, phenyl-β-naphthylamines, and alkylated α-naphthylamines.

11. The curable liquid nano-composite of claim 10, wherein the polymerization inhibitor is present in an amount less than about 2 wt %.

12. The curable liquid nano-composite of claim 1, further comprising one or more additional additives selected from the group consisting of ultraviolet (UV) absorbers, photochromic compounds, viscosity modifiers, colorants, pH adjusters, or fillers.

13. The curable liquid nano-composite of claim 1, wherein the liquid nano-composite has a viscosity of about 1 cP to about 150 cP at room temperature and pressure.

14. A method of additive manufacturing a semi-conductive component comprising printing a curable liquid nano-composite of claim 1 using said jetable piezo head device.

15. A printed object formed by additive manufacturing with the curable liquid nano-composite of claim 1 using said jetable piezo head device.

16. The printed object of claim 15, wherein the object is an opto-electronic device selected from the group consisting of, electrochromic devices, electronic interconnects, antenna, RFID tags, transistors, diodes, photovoltaics, light emitting diodes, and capacitors.

17. An antenna prepared by additive manufacturing using the curable liquid nano-composite of claim 1 and said jetable piezo head device.

18. The curable liquid nano composite of claim 1, wherein the semi-conductive component is an opto-electronic device.

19. The curable liquid nano-composite of claim 1, wherein the semi-conductive component is an electrochromic device, electronic interconnect, antenna, RFID tag, transistor, diode, photovoltaic, light emitting diode, capacitor, or combinations thereof.

* * * * *